United States Patent [19]

Stifter

[11] Patent Number: 4,636,746
[45] Date of Patent: Jan. 13, 1987

[54] FREQUENCY LOCK SYSTEM

[76] Inventor: Francis J. Stifter, 171 S. Main St., Natick, Mass. 01760

[21] Appl. No.: 769,471

[22] Filed: Aug. 26, 1985

[51] Int. Cl.⁴ .............................................. H03L 7/08
[52] U.S. Cl. ..................................... 331/1 A; 331/21; 331/27; 328/155
[58] Field of Search ..................... 331/1 A, 21, 25, 27; 328/155

[56] References Cited

U.S. PATENT DOCUMENTS 4,121,171 10/1978 Schollmeier ........................ 331/1 A
4,290,029 9/1981 Streckenbach ..................... 331/1 A
4,309,662 1/1982 Baudoux .......................... 331/1 A X

*Primary Examiner*—Siegfried H. Grimm
*Attorney, Agent, or Firm*—John E. Toupal; Harold G. Jarcho

[57] ABSTRACT

A frequency lock system including an oscillator providing a switching output voltage that switches at a given frequency between fixed periods in each of first and second states and a reference source providing a variable reference voltage that periodically varies from and returns to a given voltage level at a predetermined frequency less than ½ the given frequency. A reference lock circuit provides a reference pulse of finite width in response to occurrence of the given voltage level and an oscillator lock circuit provides a control pulse of finite width a certain period after switching of the output from its first to its second state. In addition, a reset circuit resets the oscillator to initiate a new fixed period thereof at the second state in response to temporal coincidence of the reference and control pulses.

20 Claims, 6 Drawing Figures

FREQUENCY LOCK SYSTEM

BACKGROUND OF THE INVENTION

This invention relates generally to a phase and frequency lock system and, more particularly, to a system in which a slave signal is phase and frequency locked to a master signal during a predetermined phase interval of the slave signal.

Phase and frequency lock systems are used in many applications to produce phase coincidence between master and slave signals. One common application is coherent radar in which a reference signal is locked to a transmitted signal and then phase-compared to an echo signal. Other applications involve standby and uninterruptible power supplies, television color control circuits, laboratory measurement and instruction instruments, etc. Typically, a slave signal generated by a relatively unstable oscillator is forced into phase with a master signal. Because of variation in the slave signal's frequency, that technique entails substantial phase shifting of the slave signal and results in transient disruptions thereof. Such disruptions, even though momentary, are undesirable for many applications.

The object of this invention, therefore, is to provide an improved system for phase and frequency locking a slave signal to a master signal.

SUMMARY OF THE INVENTION

The invention is a frequency lock system including an oscillator providing a switching output voltage that switches at a given frequency between fixed periods in each of first and second states and a reference source providing a variable reference voltage that periodically varies from and returns to a given voltage level at a predetermined frequency less than ½ the given frequency. A reference lock circuit provides a reference pulse of finite width in response to occurrence of the given voltage level and an oscillator lock circuit provides a control pulse of finite width a certain period after switching of the output from its first to its second state. In addition, a reset circuit resets the oscillator to initiate a new fixed period thereof at the second state in response to temporal coincidence of the reference and control pulses. The reset circuit continuously alters the frequency of the oscillator output voltage in a sense required to approach equilibrium thereof with the predetermined reference frequency.

According to one feature of the invention, the variable reference voltage is a sine wave voltage and the system includes a divider circuit means receiving the output voltage and providing a divided output voltage that switches between the first and second states at a fraction of the given frequency and a filter circuit receiving the divided output voltage and producing therewith a sine wave output. Division and filtering of the oscillator's altered output provides a symmetrical sine wave output compatible with equipment designed for use at power line frequencies.

According to another feature of the invention, the given voltage level of the reference voltage is zero. In this case, frequency lock is provided at zero crossings of the reference voltage thereby eliminating undesirable disruptions in the oscillator output voltage.

According to still another feature of the invention, the system includes a phase lock circuit for detecting periods of given matching polarities of the divided output and reference voltages and providing a phase lock signal only in response thereto and an enabling circuit providing an enabling output for enabling the reset circuit means in response to the phase lock signal. The phase lock circuit insures in-phase locking of the oscillator output and reference voltages.

According to a further feature of the invention, the system includes a circuit producing a gating signal during periods of matching polarities of the divided output and reference voltages opposite to the given matching polarities thereof and the enabling circuit enables the reset circuit in response to the gating signal. The gating signal provides a locking function at zero crossings of the reference voltage alternating with those at which phase lock occurs.

According to additional features of the invention, the phase lock circuit comprises differentiator and diode circuits producing triggering pulses in response to changes in the reference voltage between the opposite and given polarities and an AND gate providing the phase lock signal in response to coincidence of the triggering pulses and periods of the divided output at the given polarity; and the enabling circuit comprises an OR gate providing an enabling output to the reset circuit means in response to either the gating signal or the phase lock signal. This arrangement constitutes efficient circuitry for providing the desired phase and frequency locking of the oscillator output and reference voltages.

In one embodiment of the invention, the oscillator circuit comprises an oscillator and a resettable ripple counter receiving an output of predetermined frequency from the oscillator and providing a plurality of square wave outputs each having a different count down frequency of the predetermined frequency; and the reset circuit initiates new counting periods of the ripple counter. The oscillator output of this embodiment can be selected for compatibility with a variety of reference voltage frequencies.

According to specific features of the latter embodiment, the oscillator circuit further comprises a pulse shaper producing transition pulses in response to level transitions of a given sense by one of the count down frequency square wave outputs and a gate providing reset pulses in response to coincidence between the transition pulses and level transitions of a particular sense by another of the square wave outputs having a higher frequency than the one square wave output; and the reset pulses are applied to the ripple counter so as to cause resetting thereof and a reduction in the frequency of the square wave outputs. This arrangement constitutes efficient circuitry for providing an oscillator output frequency desired for a particular reference frequency.

DESCRIPTION OF THE DRAWINGS

These and other objects and features of the invention will become more apparent upon a perusal of the following description taken in conjunction with the accompanying drawings wherein.

3

Figure 5:
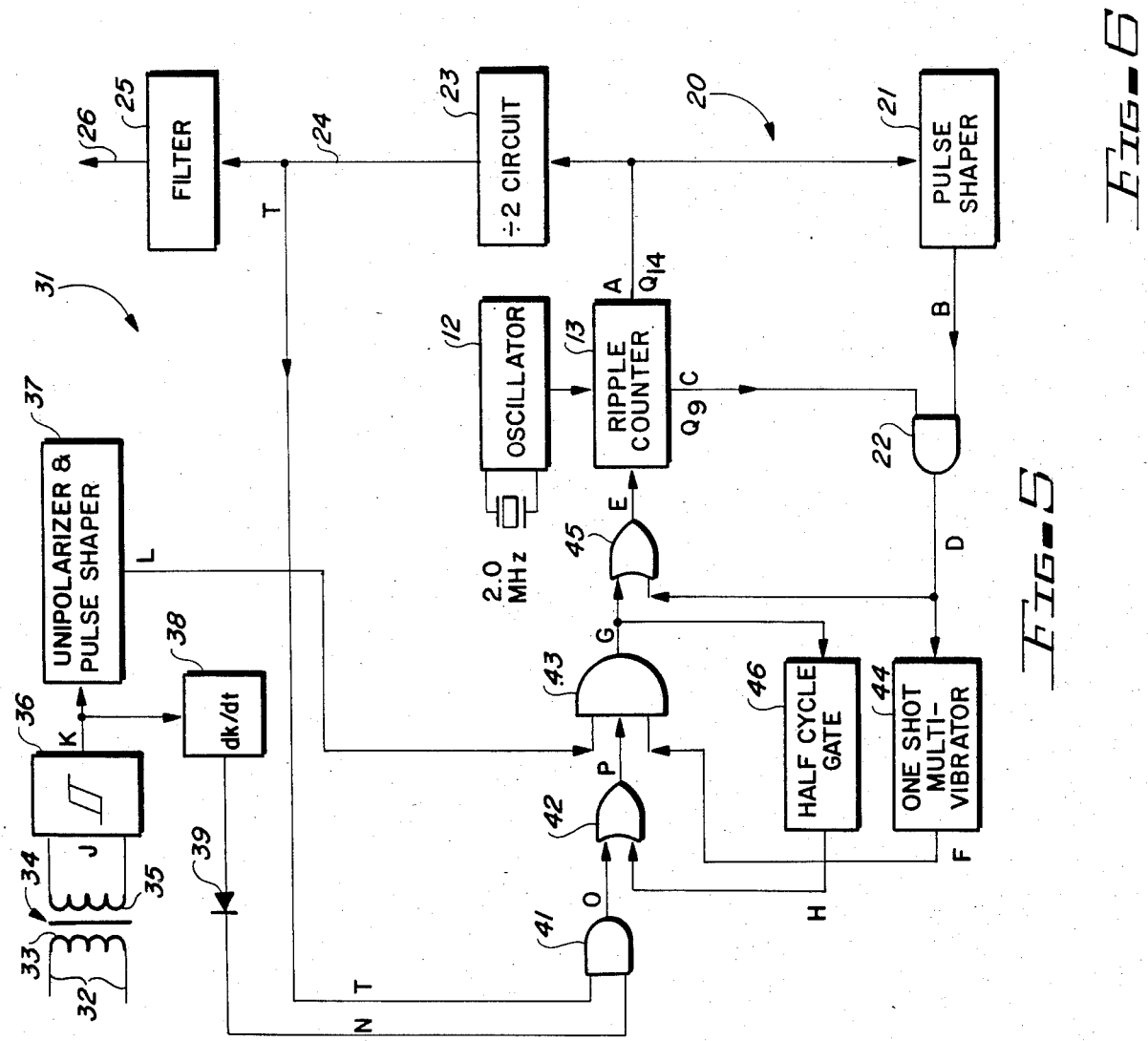

FIG. 5 is a schematic block circuit diagram of the present invention; and

Figure 6:
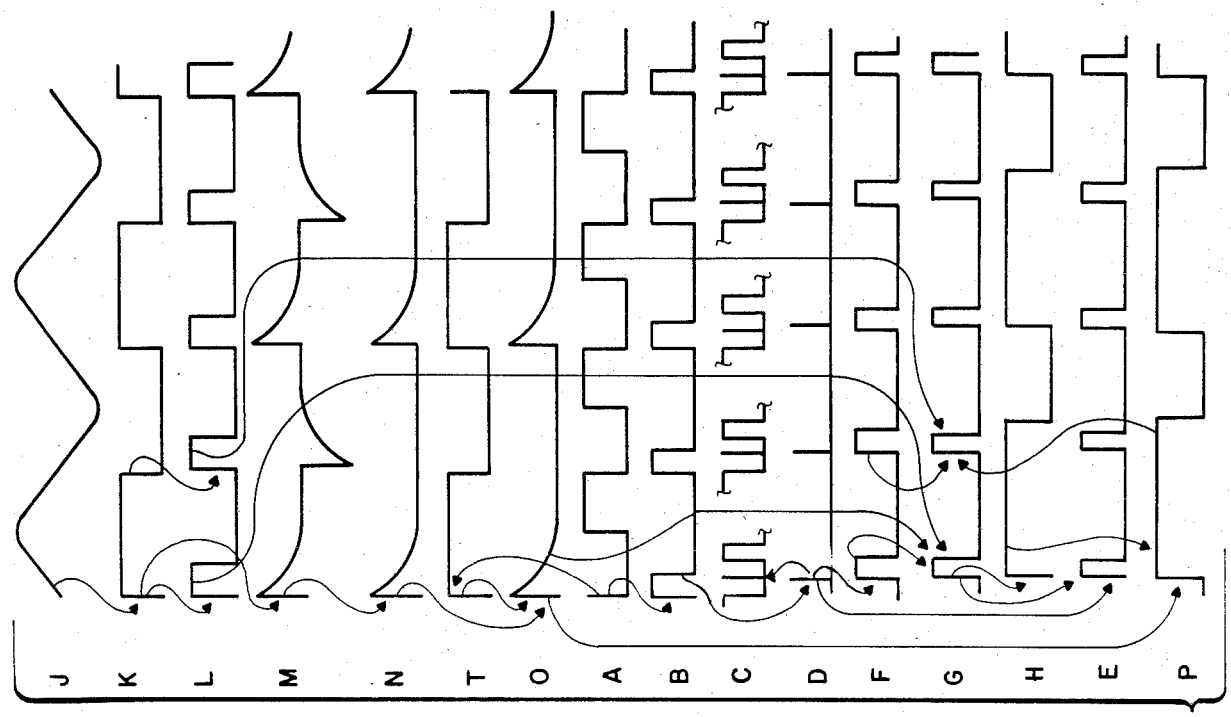

FIG. 6 is a schematic diagram illustrating waveforms produced in the circuit of FIG. 5.

DESCRIPTION OF THE PREFERRED EMBODIMENT

Figure 1:
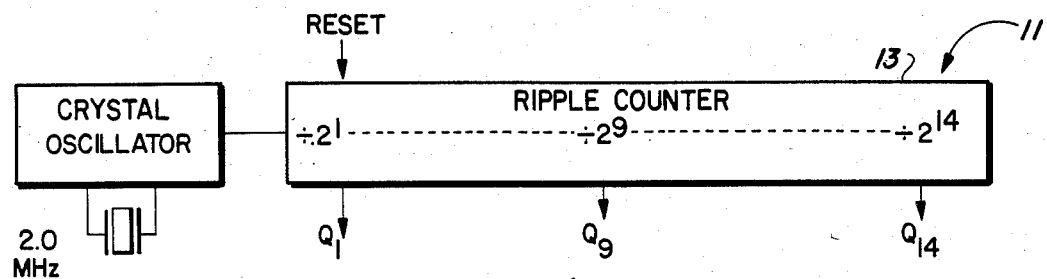
FIG. 1 is a schematic block circuit diagram depicting a basic oscillator-ripple counter arrangement.

Illustrated in FIG. 1 is an electrical system 11 for producing a plurality of square wave outputs Q1 ... Q9 ... Q14. The system 11 includes a crystal oscillator 12 that provides a stable 2.0 MHz input to a ripple counter 13 having a reset capability. Each of the outputs Q1–Q14 has a different count down frequency of the 2.0 MHz oscillator frequency. For example, the output Q1 which counts $2^1=2$ has a frequency of $10^6$ Hz and an interval/cycle of 1 usec; the output Q9 which counts $2^9=512$ has a frequency of 3,906.25 Hz and an interval/cycle of 256 usec; and the output Q14 has a frequency of 122.07 Hz and an interval/cycle of 8.192 usec.

Figure 2:
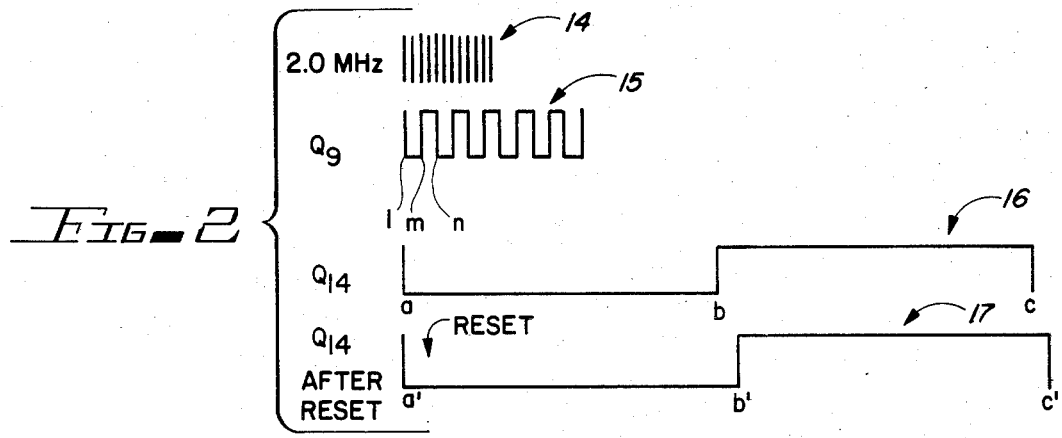
FIG. 2 is a schematic diagram illustrating waveforms produced by the circuit shown in FIG. 1.

Waveforms (14), (15) and (16) of FIG. 2 depict, respectively, the oscillator 12 output and the Q9 and Q14 square wave outputs of the counter 13. It is shown that at "start count" all counter outputs are at the "0" level. At the completion of a complete count cycle, Q14-c of waveform (16), all counters are reset to "0". Likewise, application of an external RESET command to the ripple counter 13 of FIG. 1 will automatically reset all counters to the "0" level. If RESET is applied at any time during the interval a–b of Q14 (waveform 16), no level disruption of the output waveform results. However, the time interval between a–b is extended.

As noted above, a complete cycle at Q9 output (waveform 15-interval l–n) is 256 usec; or 128 usecs for ½ cycle l–m. Application of ripple counter RESET at time designated "m" of the Q9 waveform (15) results in extending the Q14 interval a–b by 128 usec, as shown by waveform (17) interval a′–b′ in FIG. 2. The Q14 interval b–c is not affected however. Thus, interval $t_{a'b'}=4224$ usec; interval $t_{b'c'}=4096$ usec; and interval $t_{a'c'}=8320$ usec providing a frequency after reset of $1/t_{a'c'}=120.2$ Hz for Q14 which is now asymmetrical.

Figure 3:
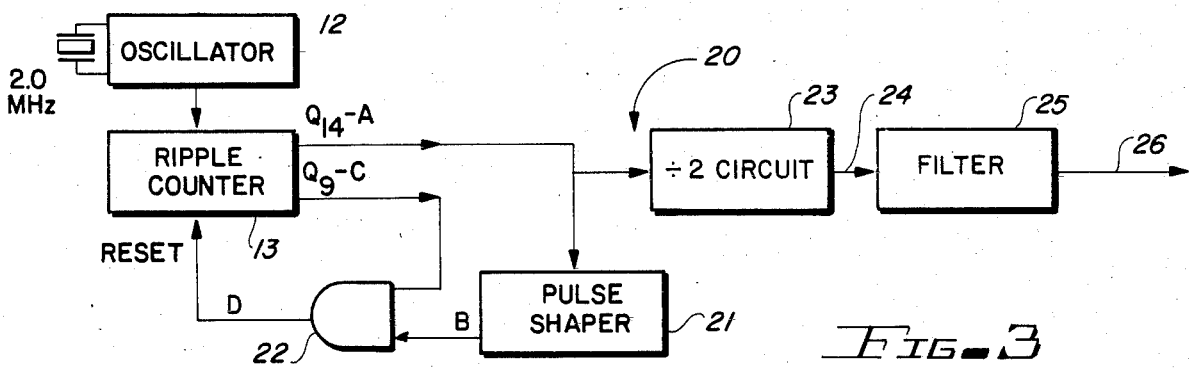
FIG. 3 is a schematic block diagram of an oscillator circuit in accordance with the present invention.
Figure 4:
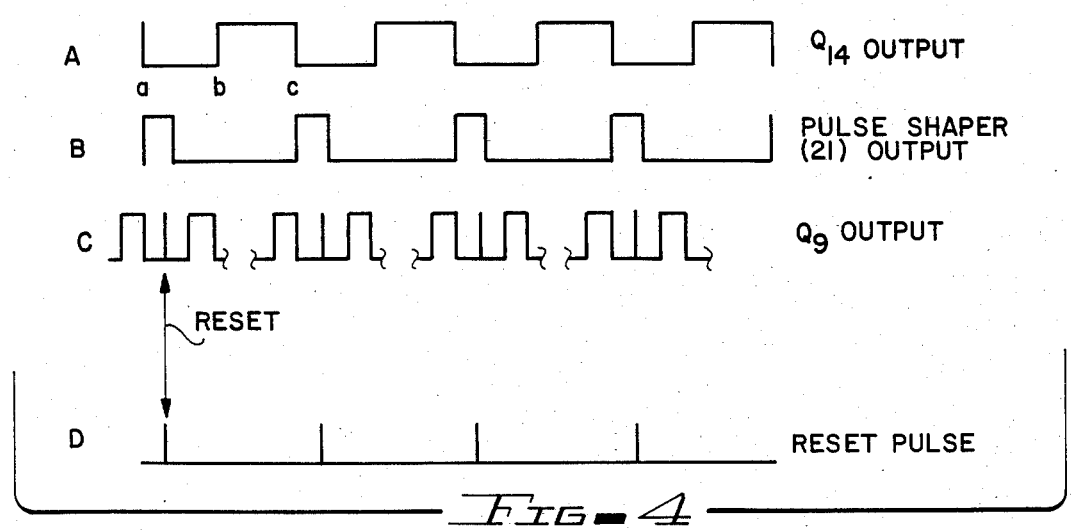
FIG. 4 is a schematic diagram illustrating waveforms produced by the oscillator circuit of FIG. 3.

FIGS. 3 and 4 depict an oscillator circuit 20 and waveforms produced thereby for implementing RESET to obtain a Q14 output pulse duration extension of 128 usec. The counter output Q14 A is applied to a pulse shaper 21 which produces a transition pulse B in response to each negative transition thereof and the waveform (B) enables an AND gate 22. Enablement occurs at a time suitable to gate out the first new count positive going pulse from the counter output Q9 (C). The duration of the waveform (B) must be greater than 128 usec and shorter than 256 usec to ensure desired counter RESET. In response to the simultaneous occurrence of a positive transition in the oscillator counter output Q9 (C), and a Shaper pulse (B), the AND gate 22 produces a reset pulse, (D), used to reset the counter. Immediately upon application of the leading edge of a reset waveform (D), all stages of the counter 13 are reset to "0". The Q9 output (C) develops only a very narrow pulse in lieu of the normal 128 usec interval and the Q14 output ab interval is extended 128 usec by this RESET process. Application of the counter Q14 output to a Divider ($\div 2$) circuit 23 results in a 60.1 Hz square wave on line 24. A filter circuit (25) removes harmonics from the generated square wave, delivering a 60.1 Hz sine wave on output line 26.

Temporal extension of the RESET period shown in FIG. 4 will produce on output line 26 a still lower resultant frequency than the indicated 60.1 Hz. For example, the provision of an additional 13.33 usec RESET period will produce exactly 120 Hz at Q14 (A) developing 60 Hz on line 24 after a $\div 2$ operation in the Divider circuit 23. Of course, still longer RESET periods will reduce an ultimate output below 60 Hz on the lines 24 and 26. In accordance with the present invention, the duration of the RESET period is controlled by a reference frequency such as a 60 Hz power line voltage. Additionally, the corrective RESET action is inhibited except during those time intervals in immediate proximity to the basic RESET pulse (D). Hence, frequency and phase lock can occur only at the time of counter RESET and since RESET affects only the zero voltage point of the ultimate waveform on the line 26, no distortion is produced.

FIG. 5 depicts a circuit 31 for effecting frequency and phase lock of the crystal oscillator 12 and counter 13 discussed above and FIG. 6 portrays waveforms generated in the circuit 31. Circuit elements and waveforms common to those shown in FIGS. 3 and 4 bear identical references in FIGS. 5 and 6. An input from a 60 Hz power line 32 is applied to a primary winding 33 of a transformer 34. Receiving a sine wave input (J) from a secondary winding 35 of the transformer 34 is a Schmitt trigger device 36. A square wave output (K) of the trigger device 36 is applied to both a Unipolarizer and Pulse Shaper 37 and a Differentiator 38. Connected to an output (M) of the Differentiator 38 is a diode 39 that provides a differentiated 60 Hz output (N) indicating positive going transitions of the input (J). The output (N) is fed to an AND gate 41 that also receives the square wave output (T) produced by the oscillator circuit 20 on line 24. In response to simultaneous occurrence of the diode output (N) and "up" periods of the oscillator output (T), the gate 41 produces a phase lock signal (O) that is applied to an OR gate 42. An enabling output (P) of the OR gate 42 is fed to a frequency AND gate 43 that also receives from the Shaper 37 reference pulses (L) produced at each zero crossing of the sine wave (J). A further input to the AND gate 43 are control pulses (F) generated by a One Shot Multivibrator and Pulse Shaper 44. A control pulse (F) is produced by the Multivibrator 44 in response to each reset pulse (D) from the gate 22 of the oscillator circuit 20. As described above, each reset pulse (D) occurs a 128 usec period after each positive to negative switching of the counter output Q14, (A). In response to temporal coincidence of an enabling output (P) from the OR gate 42, a reference pulse (L) from the Shaper 37 and a control pulse (F) from the Multivibrator 44; the frequency AND gate 43 provides a frequency lock signal (G) to a reset OR gate 45 of the oscillator circuit 20. The reset pulses (D) also are fed to the reset gate 45 that transmits both those pulses and the frequency lock pulses (G) as outputs (E) for resetting the ripple counter 13. Thus, the frequency lock pulses (G) function to extend the 128 usec reset periods of the counter 13 produced by the reset pulses (D). A half cycle gate 46 receives the frequency lock signal (G) from the gate 43 and produces a gating signal (H) that persists into a period in which the sine wave input (J) has just gone negative and the oscillator output T is "down". During that period the gating signal (H) is applied through the OR gate 42 to enable the frequency gate 43.

OPERATION

In the absence of a line frequency (60 Hz) reference (J), or when not in lock, the reset pulse (D) from Q9, is applied through the OR gate 45 to reset the counter 13 and produce waveforms and frequency described above and illustrated in FIGS. 2 and 4. Conversely, during periods in which a sine wave reference (J) exists, the circuit 31 operates in lock status in the following manner. The reference waveform (J) represents incoming 60 Hz power line voltage, while the square wave output (K) of the Schmitt trigger device 36 provides level transitions at Power Line sine wave zero crossings. In response to the waveform (K), the Unipolarizer/pulse shaper 37 provides uniform width and polarity pulses (L) corresponding to each zero crossing. These uniform pulses (L), occur at a 120 Hz rate and are passed to the AND gate 43. The waveform (K) also is acted upon by the differentiator 38 and the diode 39 providing the unipolar waveform (N) to the AND gate 41. The other input of the AND gate 41 is the waveform (T) which is the 60 Hz square wave derived from the ripple counter 13 and the divider circuit 23. Phase locking is achieved when the uniform polarity waveshapes (N) and (T) are in time coincidence. The resultant phase lock signal (O) is passed through the OR gate 42 to enable the AND gate 43.

The initial counter reset pulse (D) described above activates the multivibrator 44 to generate an oscillator locking control pulse (F) which is passed to the AND gate 43. Thus, the reference pulses (L) and the oscillator control pulses (F) are "AND"ed with the phase lock signal (O) in the AND gate 43. When present in time coincidence, these three waveforms combine to develop the frequency lock signal (G) which passes through the OR gate 45 to extend the 128 usec RESET initiated by the previous reset pulse (D) after normal counter cycling had set the waveform (A) to "0".

As discussed above, an additional reset interval of 13.33 usec provided by the frequency lock pulse (E) will result in exactly 120 Hz from the counter 13 and 60 Hz from the divider-filter network 24, 25 on line 26. The half cycle gate 46 is initiated by the leading edge of the frequency lock signal (G) to provide the gating signal (H). Since the signal (N) corresponding to positive going zero crossings of the sine wave (J) and an "up" period of the oscillator output (T) are not present to activate the AND gate 41 at negative going zero crossings of the sine wave (J), the gating signal (H) is applied to the AND gate 43 permitting generation of a frequency lock signal (G) during this interval. Time width of the reference pulses (L) and the control pulses (F) are chosen for gate overlap.

While in lock, should the frequency of the oscillator 20 increase slightly, the oscillator control pulse (F) occurs slightly earlier and a resultant frequency lock signal (G) is developed with slightly greater time duration. A longer frequency lock signal (G) lengthens the reset period of the ripple counter 13 and thereby effectively lowers the ultimate output frequency on line 26. Conversely, a slightly lower oscillator frequency results in a slightly delayed control pulse (F) and a resultant slightly shorter frequency lock signal (G). A shorter frequency lock signal (G) shortens the reset period of the ripple counter 13 and thereby effectively increases the output frequency.

Should the power line voltage 32 be lost or disrupted, no frequency lock signal (G) is produced. Therefore, the next reset period of the frequency counter 13 will be approximately 13.33 micro seconds shorter and the output frequency will revert to 60.1 Hz. Since this transition occurs at zero crossing, the filtered sine wave on line 26 will suffer no disruption or discontinuity. Upon re-application of AC line voltage 32, a frequency lock signal (G) cannot be achieved until the incoming waveform (N) and the generated waveform (T) are in phase synchronism and an oscillator lock control pulse (F) and a reference lock pulse (L) are in time alignment.

Obviously, many modifications and variations of the present invention are possible in light of the above teachings. For example only, the described system can be employed to provide output frequencies other than 60 Hz. It is to be understood, therefore, that the invention can be practiced otherwise than as specifically described.

What is claimed is:

1. A frequency lock system comprising:
   oscillator means providing a switching output voltage that switches between fixed periods in each of first and second states at a given frequency;
   reference means providing a variable reference voltage that periodically varies from and returns to a given voltage level at a predetermined frequency less than ½ said given frequency;
   reference lock means providing a reference pulse of finite width in response to occurrence of said given voltage level;
   oscillator lock means providing a control pulse of finite width a certain period after switching of said output from said first to said second state; and
   reset means for resetting said oscillator means to initiate a new said fixed period thereof at said second state in response to temporal coincidence of said reference and control pulses.

2. A system according to claim 1 including divider circuit means receiving said output voltage and providing a divided output voltage that switches between said first and second states at a fraction of said given frequency.

3. A system according to claim 2 including a filter circuit receiving said divided output voltage and producing therewith an AC output.

4. A system according to claim 3 wherein both said AC output and said reference voltage comprise sine waves.

5. A system according to claim 4 wherein said given level is zero.

6. A system according to claim 4 including phase lock means for detecting periods of given matching polarities of said divided output and reference voltages and providing a phase lock signal only in response thereto, and enabling means providing an enabling output for enabling said reset means in response to said lock signal.

7. A system according to claim 6 including means producing a gating signal during periods of matching polarities of said divided output and reference voltages opposite to said given matching polarities thereof, and wherein said enabling means enables said reset means in response to said gating signal.

8. A system according to claim 7 wherein said phase lock means comprises differentiator means and diode means producing triggering pulses in response to changes in said reference voltage between said opposite and given polarities, and AND gate means providing said phase lock signal in response to coincidence of said triggering pulses and periods of said divided output at said given polarity.

9. A system according to claim 8 wherein said enabling means comprises OR gate means providing an enabling output to said reset means in response to either said gating signal or said phase lock signal.

10. A system according to claim 1 wherein said oscillator means comprises an oscillator, and a resettable ripple counter receiving an output of predetermined frequency from said oscillator and providing a plurality of square wave outputs each having a different multiple frequency of said predetermined frequency and wherein said reset means initiates new counting periods of said ripple counter.

11. A system according to claim 10 wherein said oscillator means further comprises pulse shaper means producing transition pulses in response to level transitions of a given sense by one of said multiple frequency square wave outputs, and gate means providing reset pulses in response to coincidence between said transition pulses and level transitions of a particular sense by another of said square wave outputs having a higher frequency than said one square wave output; and wherein said reset pulses are applied to said ripple counter so as to cause resetting thereof and a reduction in the frequency of said square wave outputs.

12. A system according to claim 11 including divider circuit means receiving said output voltage and providing a divided output voltage that switches between said first and second stages at a fraction of said given frequency.

13. A system according to claim 12 including a filter circuit receiving said divided output voltage and producing therein an AC output.

14. A system according to claim 13 wherein both said AC output and said AC voltage comprise sine waves.

15. A system according to claim 14 wherein said given level is zero.

16. A system according to claim 15 including phase lock means for detecting periods of given matching polarities of said divided output and reference voltages and providing a phase lock signal only in response thereto, and enabling means providing an enabling output for enabling said reset means in response to said lock signal.

17. A system according to claim 16 wherein said reset means comprises frequency gate means providing a frequency lock signal in response to simultaneous reception of said enabling output, said control pulse, and said reference pulse; and said oscillator means further comprises reset gate means that initiates new counting periods of said ripple counter in response to reception of either said reset pulses or said frequency lock pulses.

18. A system according to claim 17 including means producing a gating signal during periods of matching polarities of said divided output and reference voltages opposite to said given matching polarities thereof, and wherein said enabling means enables said reset means in response to said gating signal.

19. A system according to claim 18 wherein said phase lock means comprises differentiator means and diode means producing triggering pulses in response to changes in said reference voltage between said opposite and given polarities, and AND gate means providing said phase lock signal in response to coincidence of said triggering pulse and periods of said divided output at said given polarity.

20. A system according to claim 19 wherein said enabling means comprises OR gate means providing an enabling output to said reset means in response to either said gating signal or said phase lock signal.

* * * * *